United States Patent
Guo

(10) Patent No.: US 8,513,142 B2
(45) Date of Patent: Aug. 20, 2013

(54) METHOD OF MANUFACTURING NON-PHOTOSENSITIVE POLYIMIDE PASSIVATION LAYER

(71) Applicant: Shanghai Hua Hong NEC Electronics Co., Ltd., Shanghai (CN)

(72) Inventor: Xiaobo Guo, Shanghai (CN)

(73) Assignee: Shanghai Hua Hong NEC Electronics Co., Ltd., Shanghai (CN)

( * ) Notice: Subject to any disclaimer, the term of this patent is extended or adjusted under 35 U.S.C. 154(b) by 0 days.

(21) Appl. No.: 13/681,889

(22) Filed: Nov. 20, 2012

(65) Prior Publication Data
US 2013/0130504 A1    May 23, 2013

(30) Foreign Application Priority Data
Nov. 22, 2011    (CN) .......................... 2011 1 0374966

(51) Int. Cl.
*H01L 21/31* (2006.01)

(52) U.S. Cl.
USPC .................... 438/781; 438/709; 257/E21.254

(58) Field of Classification Search
USPC ................. 438/661; 257/E21.023, E21.254
See application file for complete search history.

(56) References Cited

U.S. PATENT DOCUMENTS
6,544,904 B1 *    4/2003    Kamiura et al. .............. 438/781

* cited by examiner

*Primary Examiner* — Cheung Lee
(74) *Attorney, Agent, or Firm* — Michaud-Kinney Group LLP

(57) ABSTRACT

A method of manufacturing non-photosensitive polyimide passivation layer is disclosed. The method includes: spin-coating a non-photosensitive polyimide layer over a wafer and baking it; depositing a silicon dioxide thin film thereon; spin-coating a photoresist layer over the silicon dioxide thin film and baking it; exposing and developing the photoresist layer to form a photoresist pattern; etching the silicon dioxide thin film by using the photoresist pattern as a mask; removing the patterned photoresist layer; dry etching the non-photosensitive polyimide layer by using the patterned silicon dioxide thin film as a mask; removing the patterned silicon dioxide thin film; and curing to form a imidized polyimide passivation layer. The method addresses issues of the traditional non-photosensitive polyimide process, including aluminum corrosion by developer, tapered profile of non-photosensitive polyimide layer and generation of photoresist residues.

15 Claims, 6 Drawing Sheets

METHOD OF MANUFACTURING NON-PHOTOSENSITIVE POLYIMIDE PASSIVATION LAYER

CROSS-REFERENCES TO RELATED APPLICATIONS

This application claims the priority of Chinese patent application number 201110374966.8, filed on Nov. 22, 2011, the entire contents of which are incorporated herein by reference.

TECHNICAL FIELD

The present invention pertains to the fabrication of semiconductor integrated circuits, and more particular, to a method of manufacturing non-photosensitive polyimide passivation layer.

BACKGROUND

Non-photosensitive polyimide materials have been widely used in passivation layer formation processes for semiconductor devices manufacturing due to their good high-temperature resistance, excellent mechanical and electrical properties and high chemical stability. The use of non-photosensitive polyimide materials can reduce the damages to semiconductor devices generated from various natural environments and operating environments and thus improve the reliability and stability of the resultant semiconductor devices.

FIG. 1 is a flow chart illustrating a conventional method of manufacturing a non-photosensitive polyimide passivation layer. The method includes: spin-coating a non-photosensitive polyimide layer over a wafer on which a non-photosensitive polyimide passivation layer is to be formed and then baking it; spin-coating a photoresist layer over the non-photosensitive polyimide layer and baking it; removing exposed portions of the photoresist layer as well as corresponding portions of the non-photosensitive polyimide layer thereunder in a development step by an exposure-and-development process to form a desired pattern both in the photoresist layer and the non-photosensitive polyimide layer; removing the unexposed portion of the photoresist layer by using a photoresist stripper; and forming an imidized polyimide passivation layer by curing the patterned non-photosensitive polyimide layer. However, in research and practical use, this method has been found to have some drawbacks as shown in FIGS. 2 to 4.

Firstly, in the development step, in order to ensure a sufficient development for a non-photosensitive polyimide layer, the non-photosensitive polyimide layer is generally developed for a relatively long time. Such over-development may lead to the corrosion (as shown in FIG. 2) of aluminum PAD situated under some portions of the non-photosensitive polyimide layer having a smaller thickness than other portions by the developer, thus affecting the performance of the semiconductor device.

Secondly, in the development step, due to the isotropic development behavior of the developer, simultaneous with the development of the non-photosensitive polyimide layer by the developer in an intended direction, namely, the direction of the thickness of the layer (i.e., the vertical direction), the same extent development will also proceed from each lateral side of the non-photosensitive polyimide layer (i.e., the developer develops the non-photosensitive polyimide layer both in the vertical and lateral directions with same development rate). This effect will lead to a tapered and uncontrollable profile of the resultant non-photosensitive polyimide pattern (as shown in FIG. 3), which not only affects the performance of the device, but is also adverse to the miniaturization of the device as it requires comparatively big intervals between the openings (for forming pads therein) formed in the passivation layer.

Thirdly, commonly used solvents (for example, N-methylpyrrolidone (NMP)) for non-photosensitive polyimide also have a high dissolving capacity for the photoresist, thus after spin-coating the photoresist layer on the non-photosensitive polyimide layer, a portion of the photoresist will be dissolved in the non-photosensitive polyimide layer which is difficult to be removed by a photoresist stripper in a subsequent process. Therefore, photoresist residues (shown in FIG. 4) will remain in the patterned non-photosensitive polyimide layer.

SUMMARY OF THE INVENTION

The present invention addresses the above described issues of aluminum corrosion, tapered profile and photoresist residues of the prior art by presenting a new method of manufacturing non-photosensitive polyimide passivation layer.

To achieve the above objective, the method of manufacturing non-photosensitive polyimide passivation layer provided by the present invention includes the following steps:

providing a wafer on which a non-photosensitive polyimide passivation layer is to be formed;

b) spin-coating a non-photosensitive polyimide layer over the wafer and baking it;

c) depositing a silicon dioxide thin film over the non-photosensitive polyimide layer;

d) spin-coating a photoresist layer over the silicon dioxide thin film and baking it;

e) exposing and developing the photoresist layer to form a photoresist pattern;

f) etching the silicon dioxide thin film by using the photoresist pattern as a mask to form a silicon dioxide pattern;

g) removing the patterned photoresist layer;

h) dry etching the non-photosensitive polyimide layer by using the patterned silicon dioxide thin film as a mask to form a non-photosensitive polyimide pattern;

i) removing the patterned silicon dioxide thin film; and j) forming an imidized polyimide passivation layer by curing the patterned non-photosensitive polyimide layer.

In step a), a top-layer aluminum wiring & PAD are formed on the wafer, or a top-layer aluminum wiring & PAD and a patterned dielectric passivation film are formed on the wafer.

In an embodiment, the non-photosensitive polyimide material is mainly composed of a polyamic acid precursor that is not photosensitive to any light source selected from the group consisting of a G-line with a wavelength of 436 nm, an I-line with a wavelength of 365 nm, a KrF excimer laser with a wavelength of 248 nm and an ArF excimer laser with a wavelength of 193 nm. The spin-coated non-photosensitive polyimide layer is baked at a temperature of 50° C. to 200° C. for 30 seconds to 5 hours, and the baked non-photosensitive polyimide layer has a thickness of 1 μm to 50 μm. And preferably, the spin-coated non-photosensitive polyimide layer is baked at a temperature of 130° C. for 5 minutes.

In step c), the silicon dioxide thin film is grown by using a low-temperature oxidation method, which is a plasma enhanced chemical vapor deposition (PECVD) method or a photo-chemical vapor deposition (photo-CVD) method, with a reaction temperature of lower than 300° C. And preferably, the low-temperature oxidation method is a high-density plasma chemical vapor deposition (HDP-CVD) method, in which the method has a reactant gas including silane, oxygen and argon, a reaction temperature of 80° C. to 150° C., a gas pressure of 0.5 millitorr to 20 millitorr, and a radio frequency power of 500 W to 2000 W. The grown silicon dioxide thin film has a thickness of 50 Å to 5000 Å.

In step d), the spin-coated photoresist layer has a thickness of 0.5 μm to 50 μm after being baked.

In step e), the photoresist layer is exposed by using one light source selected from the group consisting of a G-line with a wavelength of 436 nm, an I-line with a wavelength of 365 nm, a KrF excimer laser with a wavelength of 248 nm and an ArF excimer laser with a wavelength of 193 nm. And preferably, the photoresist layer is exposed by using an I-line light source with a wavelength of 365 nm.

In step h), the dry etching process is a plasma dry etching process using oxygen as a main etching gas, in which the flow rate of oxygen is from 50 SCCM (standard-state cubic centimeter per minute) to 2000 SCCM; the dry etching process has a source radio frequency power of 100 W to 1500 W and a gas pressure of 20 millitorr to 2000 millitorr.

In step j), the curing process is performed at a temperature of 200° C. to 500° C. for 30 minutes to 120 minutes. And preferably, the curing process is performed at a temperature of 400° C. for 60 minutes.

The present invention has beneficial effects that the issues of aluminum corrosion by developer, tapered profile of non-photosensitive polyimide layer and generation of photoresist residues that exist in the prior art can be addressed.

In one aspect, the present invention differs from the prior art in introducing an additional silicon dioxide thin film after the spin-coating and baking of the non-photosensitive polyimide layer and before the spin-coating and baking of the photoresist layer. This silicon dioxide thin film has three benefits as follows: 1) it can isolate the non-photosensitive polyimide layer from the photoresist layer and thereby can prevent the direct contact between the two layers, so that no photoresist residues will be generated due to the dissolution of the photoresist in a certain solvent contained by the non-photosensitive polyimide material; 2) it can block the developer from developing the non-photosensitive polyimide layer as well as corroding the aluminum PAD situated under the non-photosensitive polyimide layer in the step of developing the photoresist, thus the aluminum PAD corrosion issue happened in the prior art can be eliminated; 3) it can serve as a hardmask when dry etching the non-photosensitive polyimide layer.

In another aspect, the present invention differs from the prior art in employing a dry etching process to etch the non-photosensitive polyimide layer instead of the traditional wet development process. Compared to the wet development process, the dry etching process is able to achieve anisotropic etching character (i.e., etching rate in the vertical direction is far greater than that in the lateral direction) to obtain a non-photosensitive polyimide layer with a straight profile, thus addressing the issue of tapered profile of the non-photosensitive polyimide layer caused by the isotropic etching of the wet development process occurred in the prior art.

DETAILED DESCRIPTION

The present invention will be described and specified below with reference to accompanying drawings and exemplary embodiments.

Figure 1:
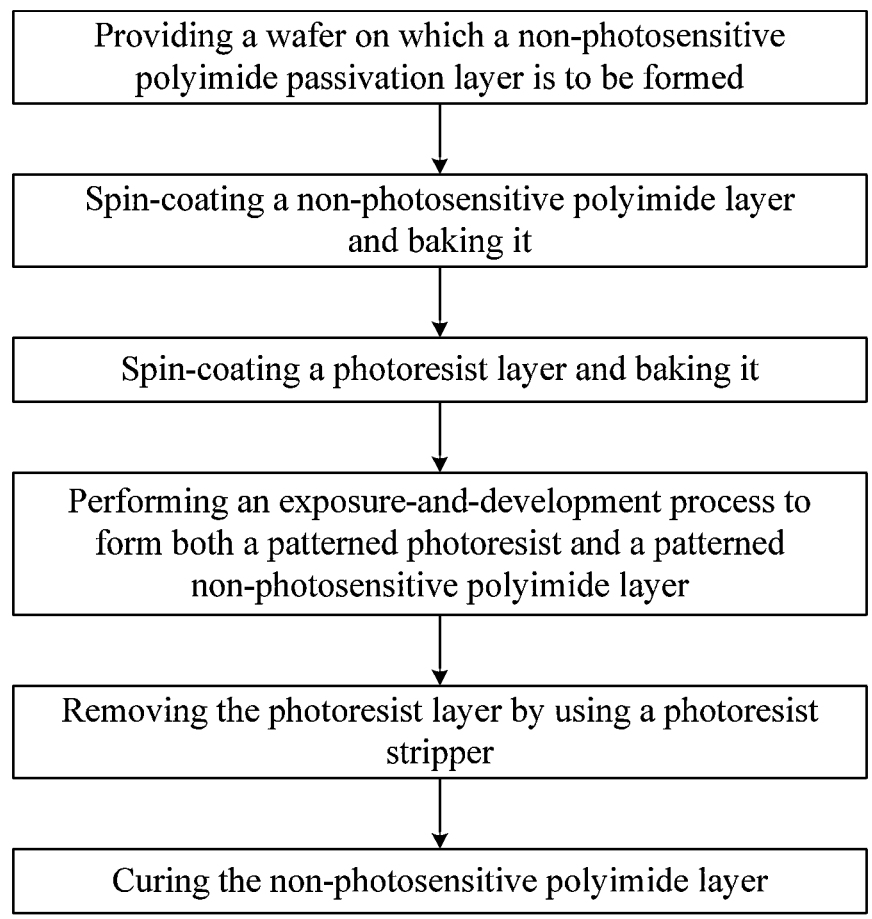
FIG. 1 is a flow chart illustrating a method of manufacturing non-photosensitive polyimide passivation layer according to the prior art.
Figure 2:
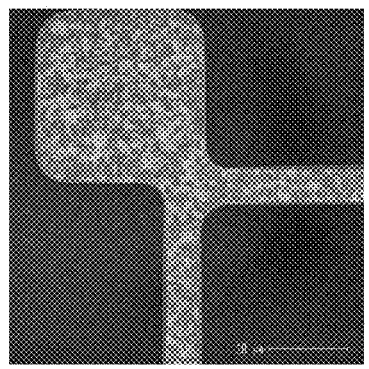
FIG. 2 is a schematic illustration of aluminum corrosion by a developer generated in the method of the prior art.
Figure 3:
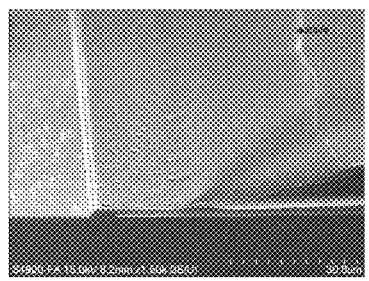
FIG. 3 is a schematic illustration of a non-photosensitive polyimide layer with an extremely tapered profile formed in the method of the prior art.
Figure 4:
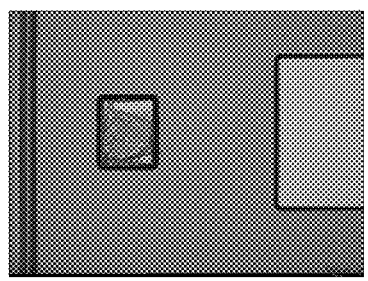
FIG. 4 is a schematic illustration of photoresist residues generated in the method of the prior art.
Figure 5:
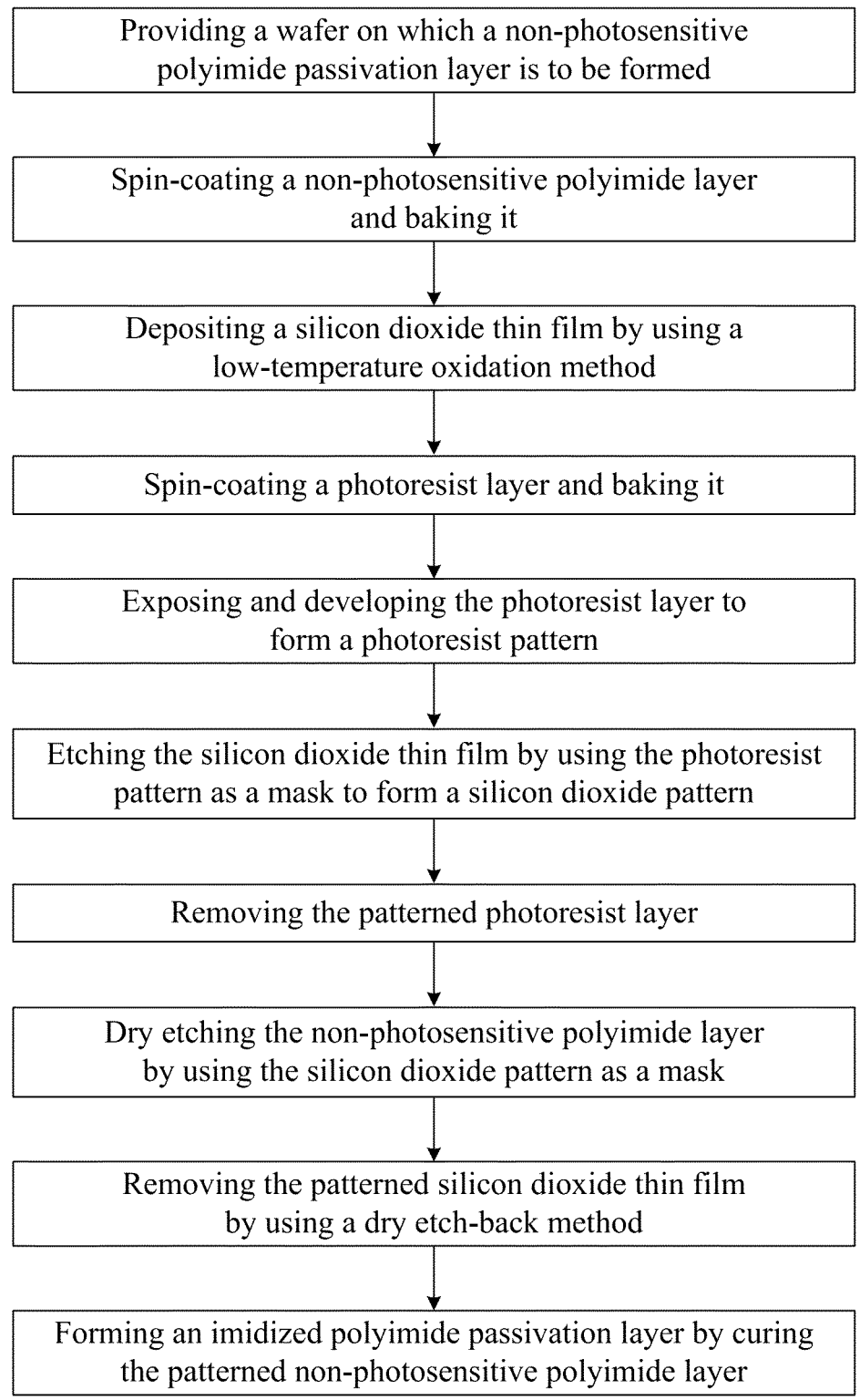
FIG. 5 is a flow chart illustrating a method of manufacturing non-photosensitive polyimide passivation layer according to the present invention.
Figure 6A:
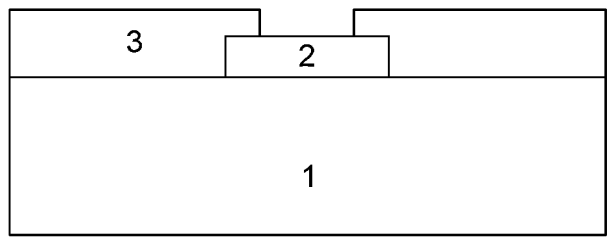
FIGS. 6A to 6I are cross-sectional diagrams schematically illustrating steps of the method of manufacturing non-photosensitive polyimide passivation layer according to the present invention.
Figure 6B:
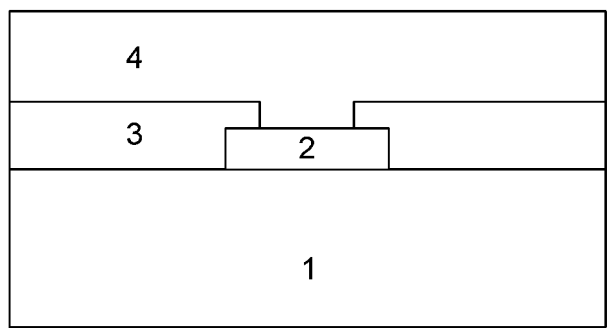
Figure 6C:
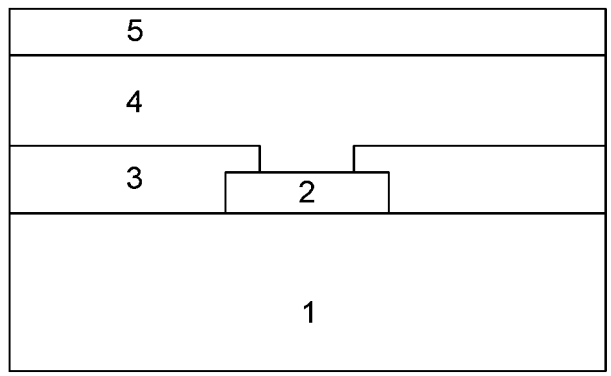
Figure 6D:
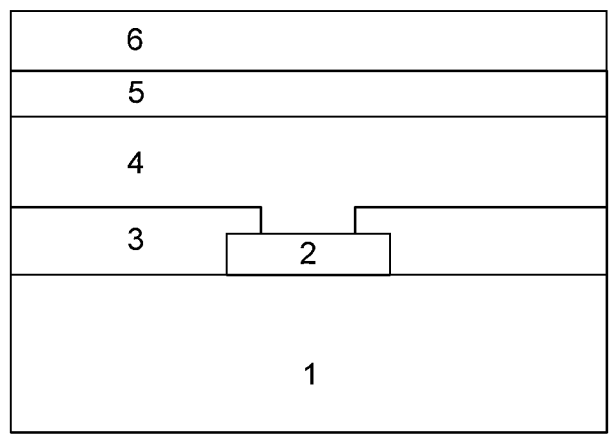
Figure 6E:
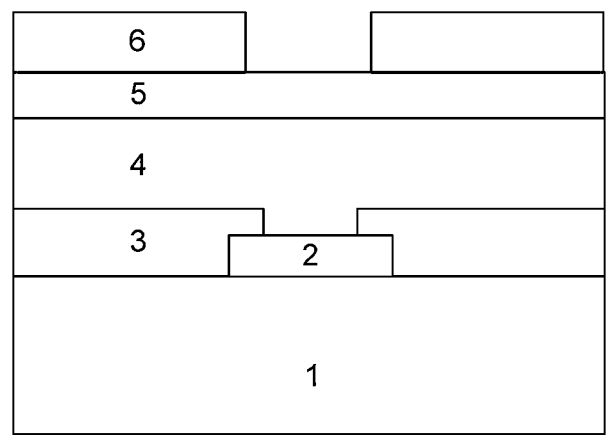

The present invention discloses a method of manufacturing non-photosensitive polyimide passivation layer. As shown in FIG. 5 and FIGS. 6A to 6I, the method includes the following steps:

Step 1: as shown in FIG. 6A, providing a wafer 1 on which a top-layer aluminum wiring & PAD 2 and a patterned dielectric passivation film 3 are formed, by using a method commonly adopted in current semiconductor process, which includes: forming a top-layer aluminum wiring & PAD 2 on the wafer 1 by using photo and etch process; depositing a dielectric passivation layer 3; and removing a certain portion of the dielectric passivation layer 3 by etch to form a contact PAD which exposes a portion of the top-layer aluminum wiring & PAD 2, wherein the dielectric passivation layer 3 may be composed of at least one selected from the group consisting of silicon nitride, silicon dioxide and silicon oxynitride; and optionally, there can be no dielectric passivation layer 3 formed on the wafer 1 according to the practical needs, i.e., the Step 2 described below is carried out just after the top-layer aluminum wiring & PAD 2 is formed on the wafer 1;

Step 2: as shown in FIG. 6B, spin-coating a non-photosensitive polyimide layer 4 and baking it, wherein the spin-coated non-photosensitive polyimide layer 4 is baked at a temperature of 50° C. to 200° C. for 30 seconds to 5 hours, and the baked non-photosensitive polyimide layer 4 has a thickness of 1 μm to 50 μm; preferably, the spin-coated non-photosensitive polyimide layer 4 is baked at a temperature of 130° C. for 5 minutes; and the non-photosensitive polyimide layer 4 is mainly composed of a polyamic acid precursor that is not photosensitive to any light source selected from the group consisting of a G-line with a wavelength of 436 nm, an Mine with a wavelength of 365 nm, a KrF excimer laser with a wavelength of 248 nm and an ArF excimer laser with a wavelength of 193 nm;

Step 3: as shown in FIG. 6C, growing a silicon dioxide thin film 5 having a thickness of 50 Å to 5000 Å by using a low-temperature oxidation method, which may be a plasma enhanced chemical vapor deposition (PECVD) method or a photo-chemical vapor deposition (photo-CVD) method with a reaction temperature of lower than 300° C.; the reason to use a low-temperature oxidation method is to prevent the imidization from occurring before curing process (Step 10 described below), preferably, the said low-temperature oxidation method is a high-density plasma chemical vapor deposition (HDP-CVD) method, which has a reactant gas including silane, oxygen and argon, a reaction temperature of 80° C. to 150° C., a gas pressure of 0.5 millitorr to 20 millitorr, and a radio frequency power of 500 W to 2000 W;

Step 4: as shown in FIG. 6D, spin-coating a photoresist layer 6 and baking it, wherein the spin-coated photoresist layer 6 has a thickness of 0.5 μm to 50 μm after being baked;

Step 5: as shown in FIG. 6E, exposing and developing the photoresist layer 6 to form a photoresist pattern by using a reticle with passivation pattern; the exposing light can be selected from the group consisting of a G-line with a wavelength of 436 nm, an I-line with a wavelength of 365 nm, a KrF excimer laser with a wavelength of 248 nm and an ArF excimer laser with a wavelength of 193 nm, and preferably an I-line light source with a wavelength of 365 nm is used in present invention.

Figure 6F:
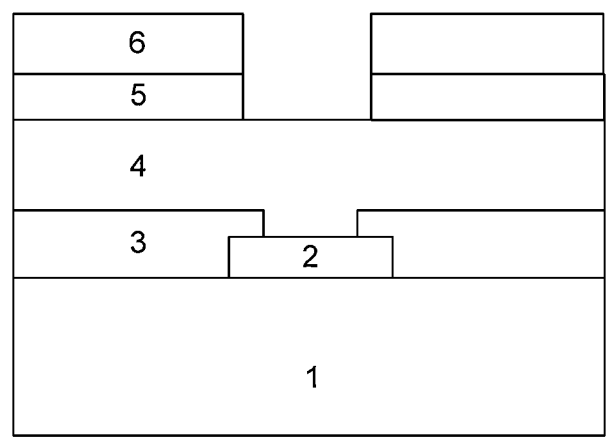
Figure 6G:
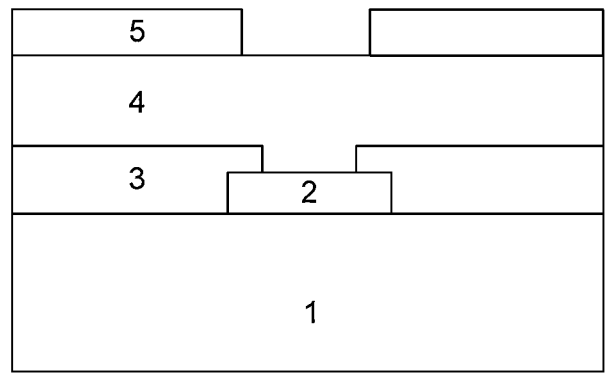
Figure 6H:
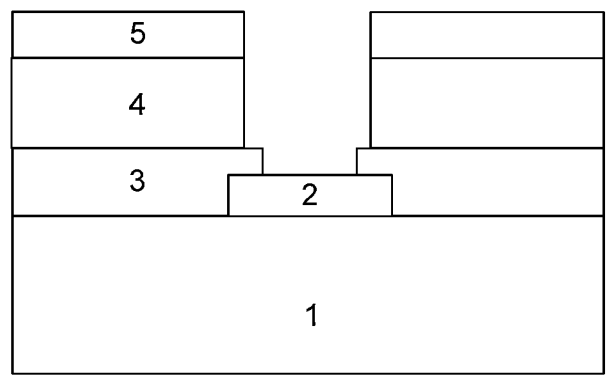

Step 6: as shown in FIG. 6F, etching the silicon dioxide thin film 5 by using the patterned photoresist layer 6 as a mask, wherein the silicon dioxide thin film 5 may be etched by using the most commonly used dry etching method for silicon dioxide etching in this art, namely, a plasma dry etching method using a carbon fluoride type gas (such as $CF_4$, $CHF_3$ and $C_4F_8$) as a main etching gas;

Step 7: as shown in FIG. 6G, removing the patterned photoresist layer 6, optionally by using, for example, oxygen plasma ashing (the dry ash method) or organic solvent stripping (the wet strip method) or combining both of them; all of these methods are commonly used in current semiconductor process;

Step 8: as shown in FIG. 6H, dry etching the non-photosensitive polyimide layer 4 by using the patterned silicon dioxide thin film 5 as a mask, wherein the dry etching process may be a plasma dry etching process using oxygen as a main etching gas, in which the flow rate of oxygen is from 50 SCCM (standard-state cubic centimeter per minute) to 2000 SCCM; the source radio frequency power of the etching gas is 100 W to 1500 W; and the gas pressure is 20 millitorr to 2000 millitorr.

Figure 6I:
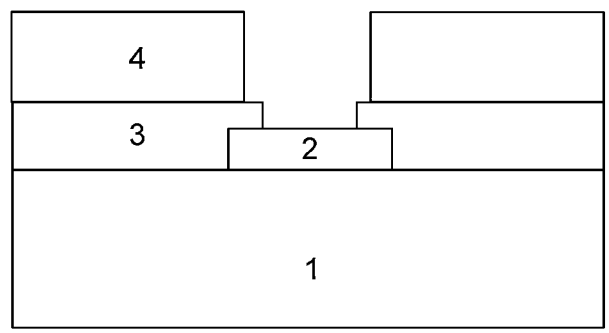

Step 9: as shown in FIG. 6I, removing the patterned silicon dioxide thin film 5 by using a dry etch-back method, which may be the commonly used method for silicon dioxide etching in current semiconductor process, namely, a plasma dry etching process using a carbon fluoride type gas (such as $CF_4$, $CHF_3$ and $C_4F_8$) as a main etching gas; and Step 10: curing the resultant structure as shown in FIG. 6I at a temperature of 200° C. to 500° C. for 30 minutes to 120 minutes, and preferably at a temperature of 400° C. for 60 minutes; by the said thermal curing process, the non-photosensitive polyimide (which is mainly composed of a polyamic acid precursor) goes through imidization and forms the final imidized polyimide passivation layer.

While preferred embodiments have been presented in the foregoing description, they are not intended to limit the invention in any way. Those skilled in the art can make various modifications and variations without departing from the spirit or scope of the invention. Thus, it is intended that the present invention embraces all such alternatives, modifications, and variations.

What is claimed is:

1. A method of manufacturing non-photosensitive polyimide passivation layer, the method comprising:
   a) providing a wafer on which a non-photosensitive polyimide passivation layer is to be formed;
   b) spin-coating a non-photosensitive polyimide layer over the wafer and baking it;
   c) depositing a silicon dioxide thin film over the non-photosensitive polyimide layer;
   d) spin-coating a photoresist layer over the silicon dioxide thin film and baking it;
   e) exposing and developing the photoresist layer to form a photoresist pattern;
   f) etching the silicon dioxide thin film by using the photoresist pattern as a mask to form a silicon dioxide pattern;
   g) removing the patterned photoresist layer;
   h) dry etching the non-photosensitive polyimide layer by using the silicon dioxide pattern as a mask to form a non-photosensitive polyimide pattern;
   i) removing the patterned silicon dioxide thin film; and
   j) forming an imidized polyimide passivation layer by curing the patterned non-photosensitive polyimide layer.

2. The method according to claim 1, wherein in step a), a top-layer aluminum wiring & pad are formed on the wafer, or a top-layer aluminum wiring & pad and a patterned dielectric passivation film are formed on the wafer.

3. The method according to claim 1, wherein in step b), the non-photosensitive polyimide layer is made of a material mainly composed of a polyamic acid precursor that is not photosensitive to any light source selected from the group consisting of a G-line with a wavelength of 436 nm, an Mine with a wavelength of 365 nm, a KrF excimer laser with a wavelength of 248 nm and an ArF excimer laser with a wavelength of 193 nm.

4. The method according to claim 1, wherein in step b), the spin-coated non-photosensitive polyimide layer is baked at a temperature of 50° C. to 200° C. for 30 seconds to 5 hours; and the baked non-photosensitive polyimide layer has a thickness of 1 μm to 50 μm.

5. The method according to claim 4, wherein in step b), the spin-coated non-photosensitive polyimide layer is baked at a temperature of 130° C. for 5 minutes.

6. The method according to claim 1, wherein in step c), the silicon dioxide thin film is grown by using a low-temperature oxidation method.

7. The method according to claim 6, wherein the low-temperature oxidation method is a plasma enhanced chemical vapor deposition method or a photo-chemical vapor deposition method, with a reaction temperature of lower than 300° C.

8. The method according to claim 6, wherein the low-temperature oxidation method is a high-density plasma chemical vapor deposition with a reactant gas including silane, oxygen and argon, a reaction temperature of 80° C. to 150° C., a gas pressure of 0.5 millitorr to 20 millitorr, and a radio frequency power of 500 W to 2000 W.

9. The method according to claim 1, wherein in step c), the grown silicon dioxide thin film has a thickness of 50 Å to 5000 Å.

10. The method according to claim 1, wherein in step d), the spin-coated photoresist layer has a thickness of 0.5 μm to 50 μm after being baked.

11. The method according to claim 1, wherein in step e), the photoresist layer is exposed by using one light source selected from the group consisting of a G-line with a wavelength of 436 nm, an Mine with a wavelength of 365 nm, a KrF excimer laser with a wavelength of 248 nm and an ArF excimer laser with a wavelength of 193 nm.

12. The method according to claim 11, wherein in step e), the photoresist layer is exposed by using an Mine light source with a wavelength of 365 nm.

13. The method according to claim 1, wherein in step h), the dry etching process is a plasma dry etching process with a source radio frequency power of 100 W to 1500 W and a gas pressure of 20 millitorr to 2000 millitorr by using oxygen as a main etching gas, the oxygen having a flow rate of 50 SCCM to 2000 SCCM.

14. The method according to claim 1, wherein in step j), the curing process is performed at a temperature of 200° C. to 500° C. for 30 minutes to 120 minutes.

15. The method according to claim 14, wherein in step j), the curing process is performed at a temperature of 400° C. for 60 minutes.

* * * * *

UNITED STATES PATENT AND TRADEMARK OFFICE
CERTIFICATE OF CORRECTION

PATENT NO. : 8,513,142 B2  
APPLICATION NO. : 13/681889  
DATED : August 20, 2013  
INVENTOR(S) : Xiaobo Guo Page 1 of 1

It is certified that error appears in the above-identified patent and that said Letters Patent is hereby corrected as shown below:

In the Claims

Column 6, Line 18, please delete "Mine" and replace with "I-line".

Column 6, Line 53, please delete "Mine" and replace with "I-line".

Column 6, Line 57, please delete "Mine" and replace with "I-line".

Signed and Sealed this
Thirty-first Day of December, 2013

Margaret A. Focarino
*Commissioner for Patents of the United States Patent and Trademark Office*